United States Patent [19]

Poon et al.

[11] Patent Number: 5,436,488

[45] Date of Patent: Jul. 25, 1995

[54] TRENCH ISOLATOR STRUCTURE IN AN INTEGRATED CIRCUIT

[75] Inventors: Stephen S. Poon; Hsing-Huang Tseng, both of Austin, Tex.

[73] Assignee: Motorola Inc., Schaumburg, Ill.

[21] Appl. No.: 332,236

[22] Filed: Oct. 31, 1994

Related U.S. Application Data

[62] Division of Ser. No. 130,052, Sep. 30, 1993, Pat. No. 5,387,540.

[51] Int. Cl.$^6$ ............................................. H01L 27/12
[52] U.S. Cl. .................................... 257/397; 257/411; 257/513
[58] Field of Search ............... 257/397, 398, 513, 514, 257/411

[56] References Cited

U.S. PATENT DOCUMENTS

| | | | |
|---|---|---|---|
| 3,793,090 | 2/1974 | Barile et al. | 148/1.5 |
| 4,497,108 | 2/1985 | Kurosawa | 257/397 |
| 4,656,497 | 4/1987 | Rogers et al. | 257/397 |
| 4,689,656 | 8/1987 | Silvestri et al. | 257/513 |
| 4,717,682 | 1/1988 | Taka et al. | 437/31 |
| 4,839,306 | 6/1989 | Wakamatsu | 437/67 |
| 4,847,214 | 7/1989 | Robb et al. | 437/67 |
| 4,851,370 | 7/1989 | Doklan et al. | 437/225 |
| 4,900,692 | 2/1990 | Robinson | 437/67 |
| 4,956,692 | 9/1990 | Ozaki et al. | 257/506 |
| 4,980,306 | 12/1990 | Shimbo | 437/34 |
| 5,099,304 | 3/1992 | Takemura et al. | 257/647 |
| 5,160,988 | 11/1992 | Higuchi et al. | 257/301 |

FOREIGN PATENT DOCUMENTS

| | | | |
|---|---|---|---|
| 58-17673 | 2/1983 | Japan | 257/411 |
| 58-46647 | 3/1983 | Japan | 437/67 |
| 60-154638 | 8/1985 | Japan | 437/67 |
| 60-160669 | 8/1985 | Japan | 257/411 |
| 63-88866 | 4/1988 | Japan | 437/67 |
| 63-185040 | 7/1988 | Japan | 437/67 |
| 2-54557 | 2/1990 | Japan . | |

OTHER PUBLICATIONS

Furukawa et al., "Gate Oxide Integrity Of Shallow--Trench-Isolation Technology," Extended Abstracts Of The Electrochemical Society, Oct. 15, 1990, pp. 415–416.

Lindenberger et al., "Submicron Mechanically Planarized Shallow Trench Isolation With Field Shield," 1991 Symposium On VLSI Technology, May 28, 1991, pp. 89–90.

Tseng et al., "Advantages Of CVD Stacked Gate Oxide For Robust 0.5 um Transistors," Proceedings Of The 1991 International Electron Devices Meeting, Dec. 8. 1991, pp. 75–78.

Tseng et al., "A Comparison Of CVD Stacked Gate Oxide And Thermal Gate Oxide For 0.5-um Transistors Subjected To Process-Induced Damage," Transactions on Electron Devices, vol. 40, No. 3, Mar. 1993, pp. 613–618.

P. C. Li et al., Gate Dielectric Structure for Field Effect Transistors, IBM Technical Disclosure Bull., vol. 17, No. 8, Jan. 1975, p. 2330.

*Primary Examiner*—Robert P. Limanek
*Attorney, Agent, or Firm*—Kent J. Cooper

[57] ABSTRACT

The reliability of integrated circuits fabricated with trench isolation is improved by increasing the thickness of the gate dielectric overlying the trench corner. After the trench isolation region (40, 56) has been formed a thin layer of silicon dioxide (44) is chemically vapor deposited over the trench isolation region (44) and the adjacent active region (23). A transistor gate electrode (46) is subsequently formed over the thin layer of silicon dioxide (44). The thin layer of silicon dioxide (44) increases the thickness of the gate dielectric that lies between the transistor gate electrode (46) and the trench corner, and therefore the breakdown voltage of the gate dielectric at the trench corner is increased.

24 Claims, 5 Drawing Sheets

TRENCH ISOLATOR STRUCTURE IN AN INTEGRATED CIRCUIT

This is divisional of application Ser. No. 08/130,052, filed Sep. 30, 1993 now U.S. Pat. No. 5,387,540.

FIELD OF THE INVENTION

This invention relates generally to semiconductor devices, and more specifically to a trench isolation structure in an integrated circuit and its method of formation.

BACKGROUND OF THE INVENTION

The semiconductor industry continually strives to increase device performance and device density by reducing device dimensions. For a given chip size, device density can be increased by reducing the lateral distance separating active devices, or the device isolation width. The desire to reduce device isolation width, while maintaining the necessary electrical isolation between adjacent active devices, has led to the development of several different isolation schemes.

One technique which as been proposed for device isolation in high density integrated circuits is trench isolation. With trench isolation, field oxide encroachment of the surrounding active regions is eliminated, and therefore device isolation width can be reduced. Unfortunately, integrated circuits fabricated with existing trench isolation schemes often suffer from premature gate oxide breakdown, and thus have poor reliability. One reason for the premature breakdown is that gate oxide grown near the trench corner has a lower breakdown voltage as compared to that grown in other areas. This is because near the trench corner the silicon substrate oxidizes at a slower rate during gate oxidation, and this results in the gate oxide being thinner near the trench corner, as compared to that grown in other areas. In addition, due to the abrupt profile of the trench corner, high electric fields are generated near the trench edge during device operation, and these high electric fields further degrade the breakdown voltage of the thinned gate oxide. Accordingly, a need exists for a trench isolation structure that allows high density integrated circuits to be fabricated with improved reliability.

SUMMARY OF THE INVENTION

The previously mentioned problems with integrated circuits fabricated with existing trench isolation schemes are overcome by the present invention. In one embodiment of the invention a trench isolation structure in an integrated circuit has a semiconductor substrate with a trench isolation region formed therein. It has an active region lying within the semiconductor substrate, and the active region abuts the trench isolation region. It has a first dielectric layer overlying the trench isolation region and the active region, and the first dielectric layer has a thickness of less than 20 nanometers. It has a transistor gate electrode overlying the first dielectric layer, the active region, and the trench isolation region. Other aspects of the invention also involve methods for making the trench isolation structure in an integrated circuit. These and other features, and advantages, will be more clearly understood from the following detailed description taken in conjunction with the accompanying drawings. It is important to point out that the illustrations may not necessarily be drawn to scale, and that there may be other embodiments of the present invention that are not specifically illustrated.

DETAILED DESCRIPTION OF A PREFERRED EMBODIMENT

Figure 1:
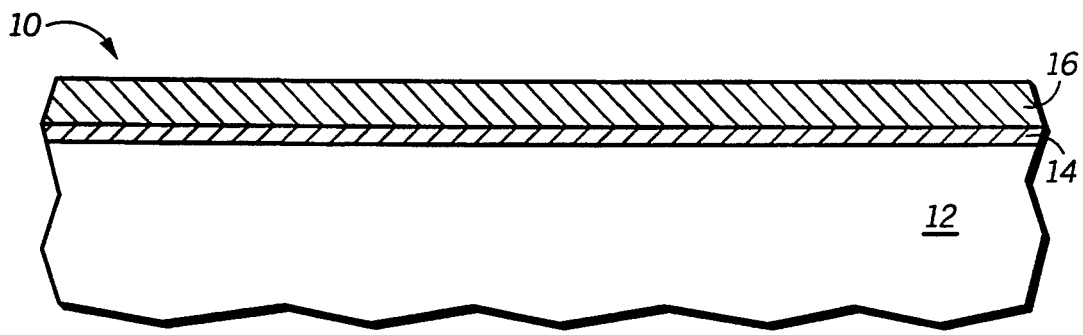
FIGS. 1–10 illustrate, in cross-section, process steps in accordance with one embodiment of the invention.

FIGS. 1 through 10 illustrate, in cross-section, process steps in accordance with one embodiment of the invention wherein a trench isolation structure is formed in an integrated circuit. Shown in FIG. 1 is a portion 10 of an integrated circuit structure comprising a semiconductor substrate 12, a buffer layer 14, and an etch stop layer 16. Semiconductor substrate 12 is preferably a monocrystalline silicon substrate. Alternatively, semiconductor substrate 12 may also be a silicon on insulator substrate, a silicon on sapphire substrate, or the like. Semiconductor substrate 12 is preferably thermally oxidized to form buffer layer 14, which may have a thickness ranging from 10 to 100 nanometers. Alternatively, buffer layer 14 may be chemical vapor deposited silicon dioxide. Following the formation of buffer layer 14, etch stop layer 16 is formed over buffer layer 14. In accordance with a preferred embodiment, etch stop layer 16 is preferably chemical vapor deposited silicon nitride, which may have a thickness ranging from 50 to 200 nanometers. Alternatively, etch stop layer 16 may also be another material, such as boronitride or silicon oxynitride.

Figure 2:
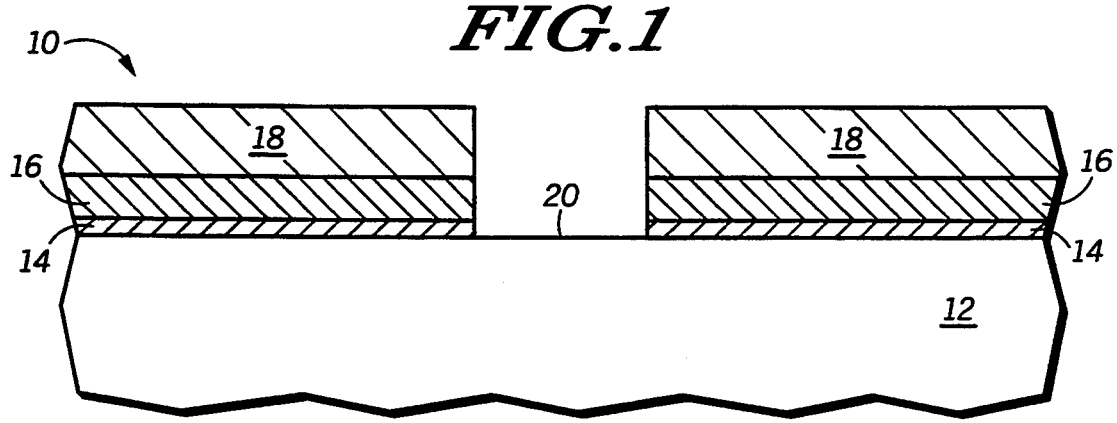

In FIG. 2, a photoresist mask 18, which overlies a portion of etch stop layer 16, is used to pattern etch stop layer 16 and underlying buffer layer 14 so that a first portion 20 of semiconductor substrate 12 is exposed. Photoresist mask 18 is formed using standard photolithographic patterning processes, and etch stop layer 16 and buffer layer 14 are patterned using standard etching techniques.

Figure 3:
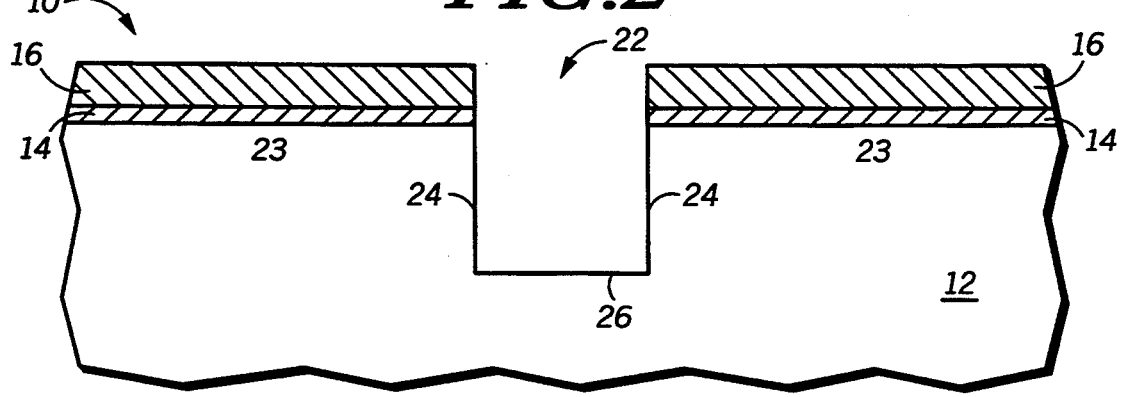

In FIG. 3, first portion 20 of semiconductor substrate 12 is then anisotropically etched using standard etching techniques to form a trench 22. Trench 22 also defines an active region 23 within a second portion of semiconductor substrate 12, as shown in FIG. 3. Trench 22 has a trench sidewall 24 and a trench bottom 26, and active region 23 abuts trench sidewall 24. After trench 22 has been formed, photoresist mask 18 is then removed using standard photoresist stripping techniques.

Figure 4:
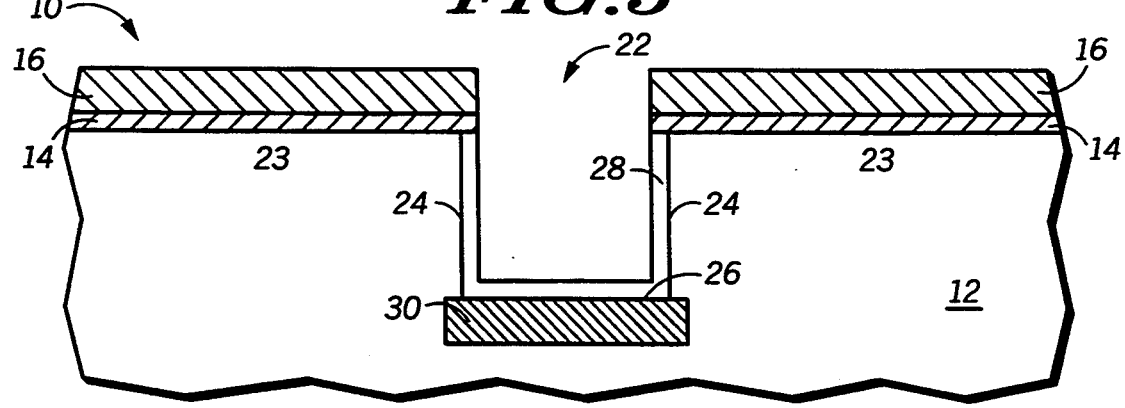

In FIG. 4, a trench liner 28 is then formed adjacent to trench sidewall 24 and trench bottom 26. Trench liner 28 has a thickness that is insufficient to fill trench 22. In a preferred embodiment trench liner 28 is a layer of thermal silicon dioxide, which may have a thickness ranging from 5 to 100 nanometers, and which is formed by thermally oxidizing trench sidewall 24 and trench bottom 26. Alternatively, trench liner 28 may also be another dielectric material, such as silicon oxynitride. In addition, as shown in FIG. 4, a portion of silicon substrate 12 underlying trench bottom surface 26 may also be implanted with ions to form a channel stop region 30 adjacent to trench bottom 26. Channel stop region 30 may be formed either before or after the formation of trench liner 28.

Figure 5:
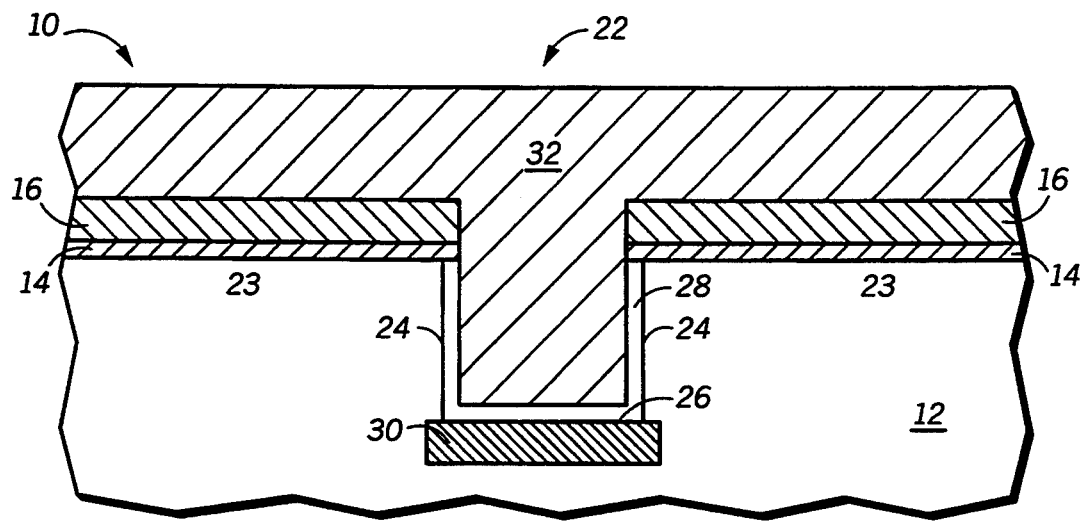

In FIG. 5, a trench fill material 32 is then formed overlying etch stop layer 16 and trench liner 28, such that trench 22 is substantially filled. In a preferred embodiment, trench fill material 32 is chemically vapor deposited silicon dioxide, which is deposited using ozone and tetraethylorthosilicate (TEOS) as source gases. Alternatively, trench fill material 32 may also be another dielectric material, such as germanium oxide, spin-on-glass, et cetera, or a combination of different materials such as polysilicon and silicon dioxide. In addition, trench fill material 32 may be formed using other techniques such as plasma enhanced chemical vapor deposition, electron cyclotron resonance deposition, or spin-on deposition.

Figure 6:
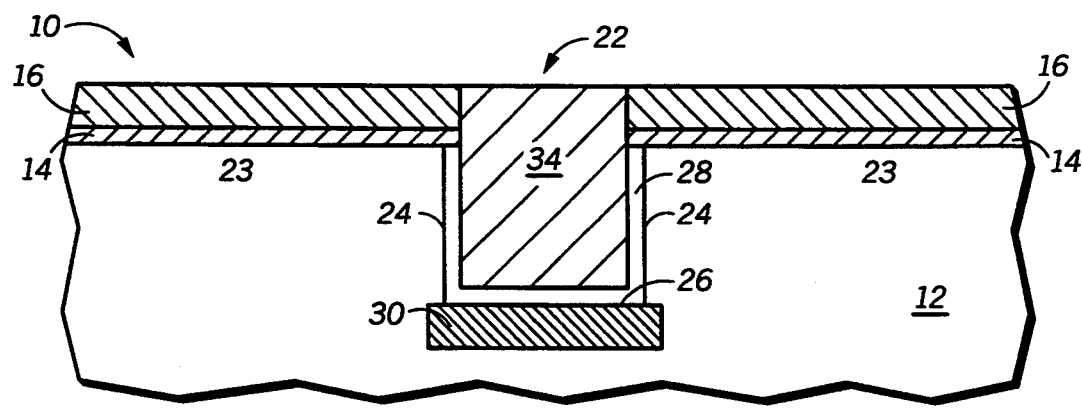

In FIG. 6, a portion of trench fill material 32 is then selectively removed to expose etch stop layer 16, and to form a trench plug 34 that substantially fills trench 22. As shown in FIG. 6, trench plug 34 lies within trench 22 and is adjacent to trench liner 28. In a preferred embodiment, chemical mechanical polishing is used to selectively remove a portion of trench plug material 32 and form trench plug 34. Alternatively, standard wet or plasma etching techniques may also be used to form trench plug 34, or a combination of chemical mechanical polishing and standard etching techniques may also be used to form trench plug 34.

Figure 7:
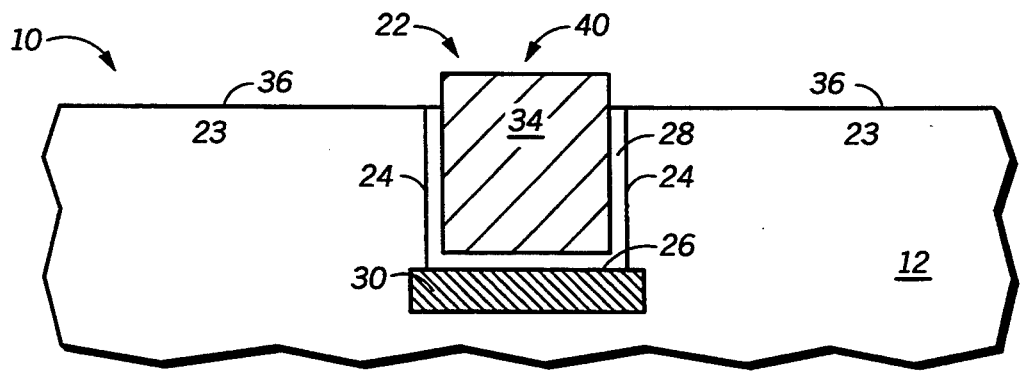

In FIG. 7, etch stop layer 16 and buffer layer 14 are then removed to expose a surface portion 36 of active region 23, and to form a trench isolation region 40 in semiconductor substrate 12, wherein trench isolation region 40 comprises trench 22, trench liner 28 and trench plug 34. As shown in FIG. 7, active region 23 abuts trench isolation region 40. In accordance with a preferred embodiment, wherein etch stop layer 16 and buffer layer 14 are silicon nitride and silicon dioxide, respectively, etch stop layer 16 may be removed in phosphoric acid and buffer layer 14 may be removed in buffered hydrofluoric acid. Alternatively, etch stop layer 16 may also be removed using standard dry etching techniques.

Figure 8:
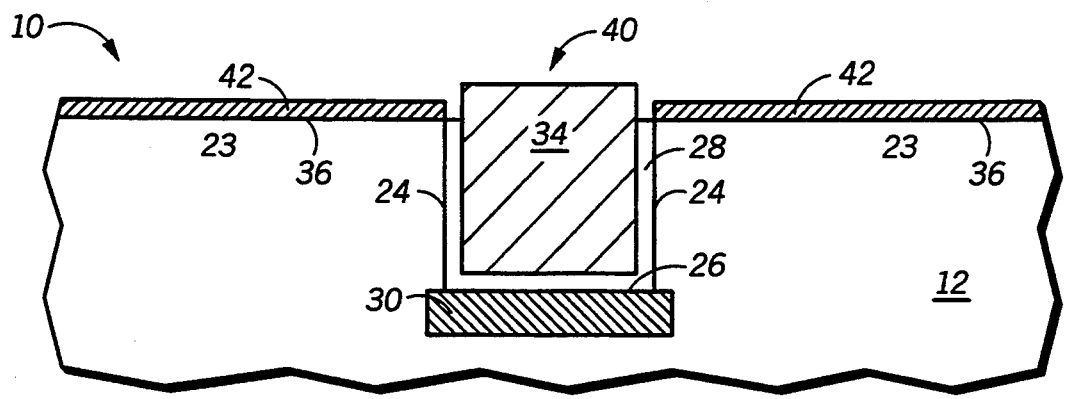

In FIG. 8, a first dielectric layer 42 having a thickness of less than 20 nanometers is then formed overlying active region 23. In a preferred embodiment first dielectric layer 42 is thermal silicon dioxide, which is formed by thermally oxidizing exposed surface portion 36. Alternatively, first dielectric layer 42 may be another dielectric material such as silicon oxynitride, which may be formed by thermally nitriding a layer of thermal silicon dioxide in an ambient containing ammonia ($NH_3$), nitrous oxide ($N_2O$), or nitric oxide (NO). Alternatively, a layer of silicon oxynitride could also be formed by direct nitridation of exposed surface 36 in an ambient containing one of the previously mentioned gases. In addition, a sacrificial layer of thin thermal oxide may be formed over exposed surface 36, and then subsequently stripped prior to forming first dielectric layer 42.

Figure 9:
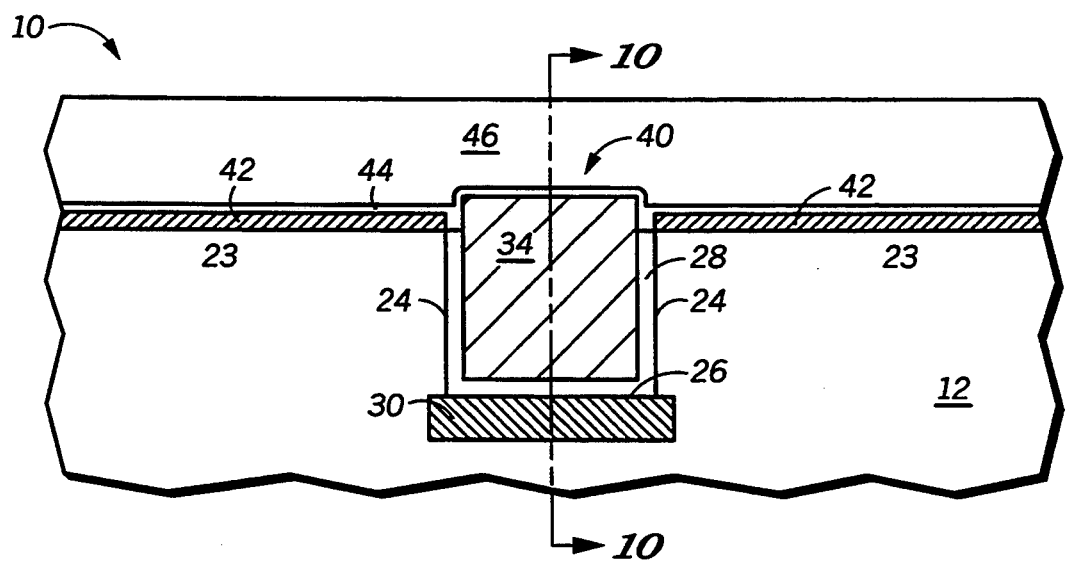

In FIG. 9, a second dielectric layer 44 is then formed overlying first dielectric layer 42, active region 23, and trench isolation region 40. In addition, second dielectric layer 44 and first dielectric layer 42 have a combined thickness of less than 20 nanometers. In a preferred embodiment second dielectric layer 44 is chemically vapor deposited silicon dioxide, which has been densified after deposition in an ambient containing nitrogen and oxygen for approximately thirty minutes at a temperature of approximately 1000 degrees Celsius. Alternatively, second deposited dielectric layer 44 may be another dielectric layer such as silicon oxynitride, which may be formed by thermally nitriding a layer of chemically vapor deposited silicon dioxide in an ambient containing ammonia ($NH_3$), nitrous oxide ($N_2O$), or nitric oxide (NO). A conductive layer is then subsequently deposited and patterned to form a transistor gate electrode 46, wherein first dielectric layer 42 and second dielectric layer 44 form a composite gate dielectric that underlies transistor gate electrode 46. As shown in FIG. 9, second dielectric layer 44 increases the total thickness of the gate dielectric at the trench corner. In addition, because second dielectric layer 44 is conformally deposited the total thickness of the gate dielectric adjacent the trench corner may be increased by an amount that is essentially two times the thickness of second dielectric layer 44. This is because the area between the trench plug and the trench corner is filled or plugged by second dielectric layer 44. Therefore, the breakdown voltage of the gate dielectric lying between the trench corner and the overlying transistor gate electrode is increased. In a preferred embodiment first transistor gate electrode 46 comprises polysilicon. Alternatively, transistor gate electrode 36 may be a metal, a metal silicide, a metal nitride, or a composite of polysilicon and a metal, or a composite of polysilicon and a metal silicide, or a composite of polysilicon and a metal nitride. As shown in FIG. 9, transistor gate electrode 46 overlies second deposited dielectric layer 44, active region 23, and trench isolation region 40.

Figure 10:
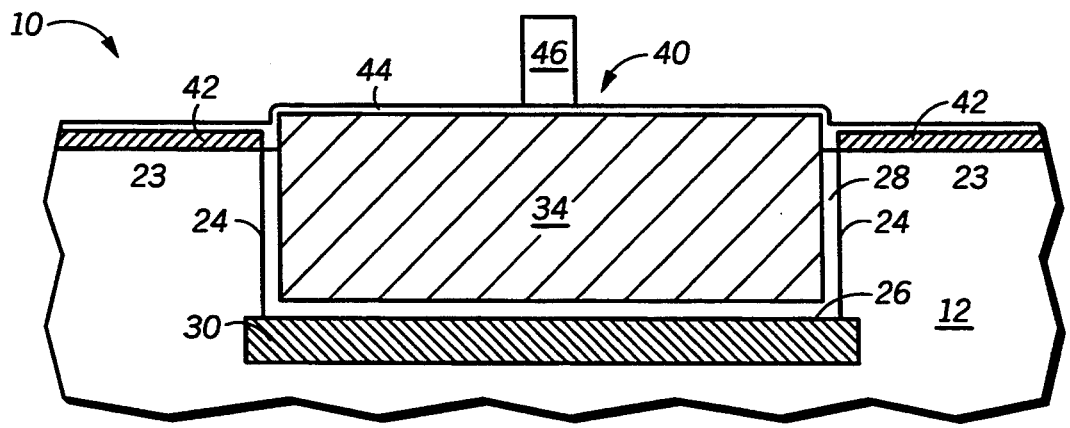

A cross-sectional view of FIG. 9 taken along the line 10—10 is shown in FIG. 10.

Figure 11:
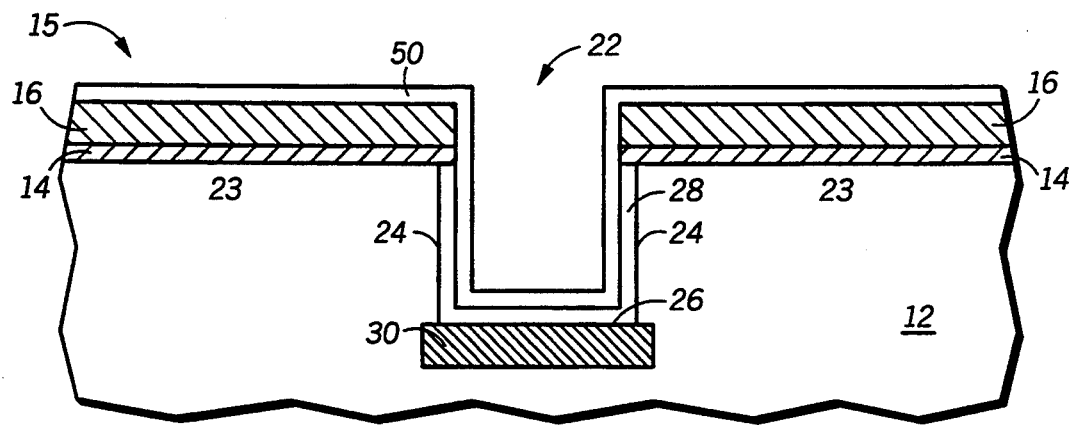
FIGS. 11–15 illustrates, in cross-section, process steps in accordance with an alternative embodiment of the invention.

FIGS. 11 through 15 illustrate, in cross-section, process steps in accordance with an alternative embodiment of the invention wherein a trench isolation structure is formed in an integrated circuit. Shown in FIG. 11 is a portion 15 of an integrated circuit structure wherein a second trench liner 50 is subsequently formed over the integrated circuit structure of FIG. 4. Second trench liner 50 is formed adjacent to trench liner 28, and is subsequently used to form a composite trench liner. In a preferred embodiment, trench liner 28 is a layer of thermal silicon dioxide and second trench liner 50 is a layer of silicon nitride.

Figure 12:
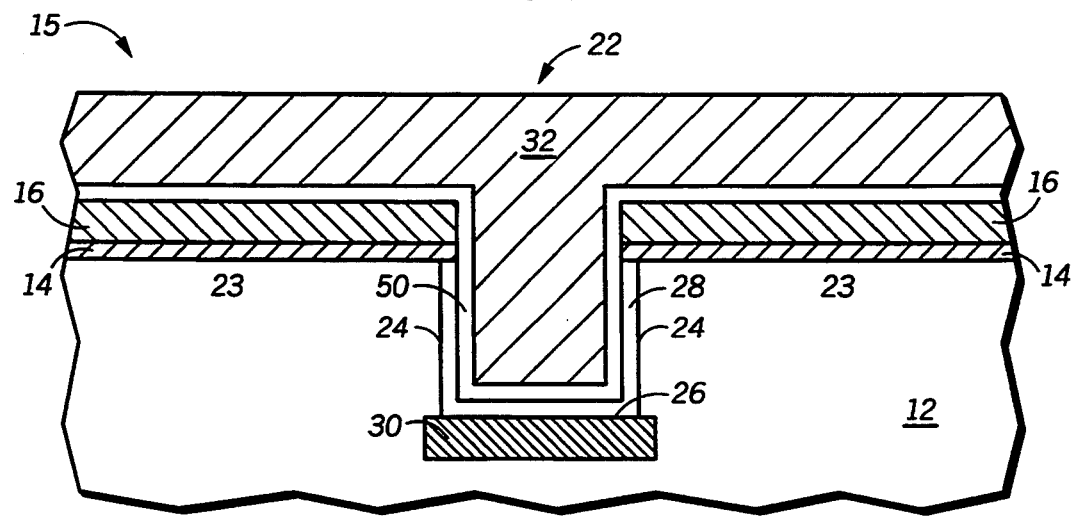

In FIG. 12, a trench fill material 32 is then formed overlying second trench liner 50, such that trench 22 is substantially filled. In a preferred embodiment, trench fill material 32 is chemically vapor deposited silicon dioxide, which is deposited using ozone and tetraethylorthosilicate (TEOS) as source gases. Alternatively, trench fill material 32 may also be another dielectric material, such as germanium oxide, spin-on-glass, et cetera, or a combination of different materials such as polysilicon and silicon dioxide. In addition, trench fill material 32 may be formed using other techniques such as plasma enhanced chemical vapor deposition, electron cyclotron resonance deposition, or spin-on deposition.

Figure 13:
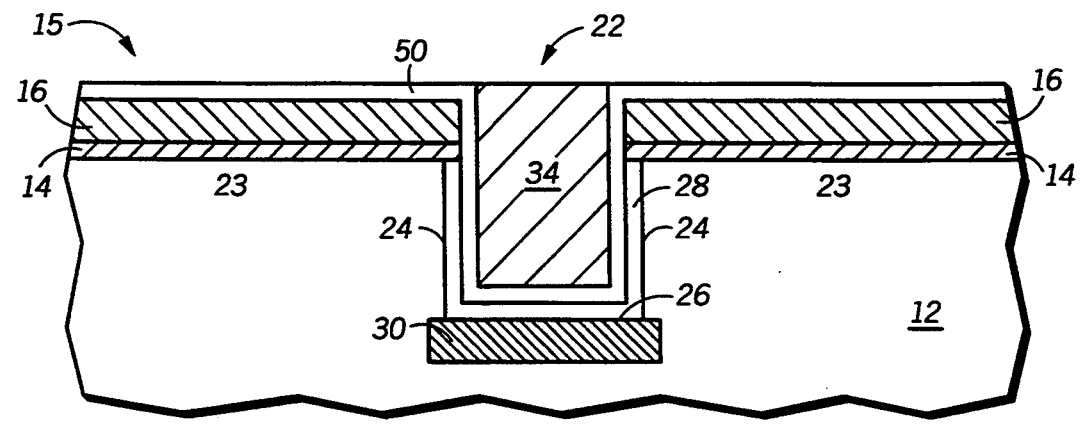

In FIG. 13, a portion of trench fill material 32 is then selectively removed to expose a portion of second trench liner 50, and to form a trench plug 34 that substantially fills trench 22. In a preferred embodiment, chemical mechanical polishing is used to selectively remove a portion of trench plug material 32 and form trench plug 34. Alternatively, standard wet or plasma etching techniques may also be used to form trench plug 34, or a combination of chemical mechanical polishing and standard etching techniques may also be used to form trench plug 34.

Figure 14:
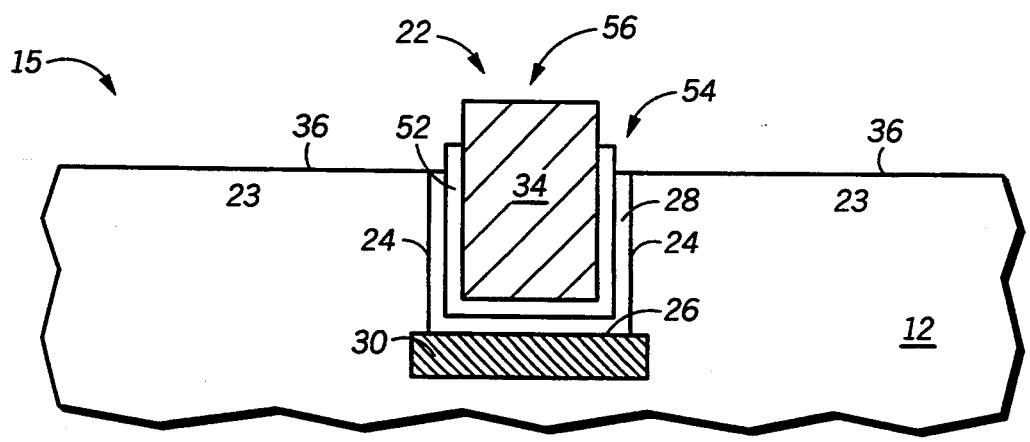

In FIG. 14, the exposed portion of second trench liner 50 is then removed to leave a remaining portion 52 of second trench liner 50, and to form a composite trench liner 54 comprising remaining portion 52 and trench liner 28. Etch stop layer 16 and buffer layer 14 are then removed to expose a surface portion 36 of active region 23, and to form a trench isolation region 56 in semiconductor substrate 12, wherein trench isolation region 56 comprises trench 22, composite trench liner 54 and trench plug 34. As shown in FIG. 7, active region 23 abuts trench isolation region 56. In accordance with a preferred embodiment, wherein etch stop layer 16 and second trench liner 14 are silicon nitride and buffer layer 14 is silicon dioxide, etch stop layer 16 and the exposed portion of second trench liner 50 may be removed in phosphoric acid and buffer layer 14 may be removed in buffered hydrofluoric acid. Alternatively, the etch stop layer 16 and the exposed portion of the second trench liner 50 may also be removed using standard dry etching techniques. In addition, although it is not shown in FIG. 14, second trench liner 50 may also be formed such that remaining portion 52 does not extend above exposed surface portion 36.

Figure 15:
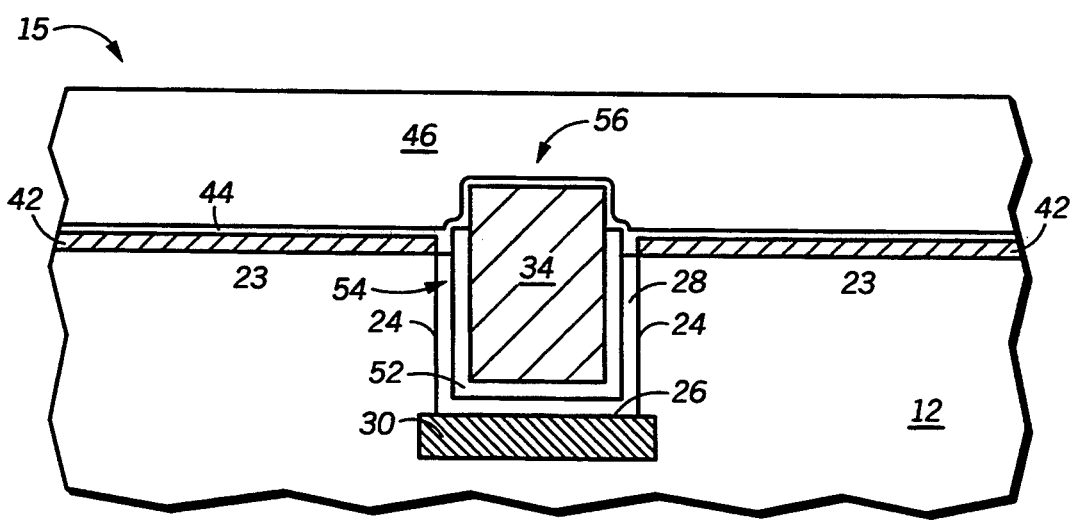

In FIG. 15, first dielectric layer 42, second deposited dielectric layer 44 and transistor gate electrode 46 are then formed as previously described in FIGS. 8-9, and these processing steps result in the formation of the trench isolation structure shown in FIG. 15.

The foregoing description and illustrations contained herein demonstrate many of the advantages associated with the present invention. In particular, it has been revealed that the thickness of the gate dielectric overlying the trench corner can be increased by forming a dielectric layer which overlies both the trench isolation region and the adjacent active region. Therefore, the breakdown voltage of the gate dielectric overlying the trench corner is increased. Moreover, since the gate dielectric overlying the trench corner has a higher breakdown voltage the reliability of integrated circuits fabricated with trench isolation is increased because they are now less susceptible to premature gate oxide breakdown. Therefore, integrated circuits with high device densities and high reliability can be manufactured.

Thus it is apparent that there has been provided, in accordance with the invention, a trench isolation structure in an integrated circuit that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the invention is not limited to a specific type of trench isolation region. Trench isolation regions other than those shown in FIGS. 7 and 14 may also be used. In addition, the invention is not limited to a specific trench shape, depth or width. Furthermore, the invention is not limited to a specific trench fill material. In addition, first dielectric layer 42 need not be formed under second dielectric layer 44 in order to obtain an increase in breakdown voltage at the trench corner, because second dielectric layer 44 will not be thinned near the trench corner. Moreover, the invention is not limited to a specific number of layers for the trench liner, or to specific liner materials. Therefore, it is intended that this invention encompass all such variations and modifications as fall within the scope of the appended claims.

We claim:

1. A trench isolation structure in an integrated circuit comprising:
   a semiconductor substrate having a trench formed therein, the trench having a trench bottom and a trench sidewall;
   an active region lying within the semiconductor substrate and abutting the trench sidewall;
   a trench liner adjacent the trench sidewall and the trench bottom, the trench liner having a thickness insufficient to fill the trench;
   a trench plug adjacent the trench liner and substantially filling the trench;
   a first dielectric layer overlying only the active region;
   a second dielectric layer overlying the trench plug and the first dielectric layer, wherein the first dielectric layer and the second dielectric layer form a gate dielectric layer, the gate dielectric layer having a thickness of less than 20 nanometers;
   a transistor gate electrode overlying the gate dielectric layer, the active region, and the trench plug.

2. The device of claim 1, wherein the first dielectric layer comprises a material selected from a group consisting of silicon dioxide and silicon oxynitride.

3. The device of claim 1, wherein the second dielectric layer is chemically vapor deposited silicon dioxide.

4. The device of claim 1, wherein the trench liner comprises a material selected from a group consisting of silicon dioxide, silicon oxynitride, and silicon nitride.

5. The device of claim 1, wherein the trench liner is a layer of thermal silicon dioxide.

6. The device of claim 1, wherein the trench liner is further characterized as a composite layer, wherein the composite layer comprises a layer of thermal silicon dioxide underlying a layer of silicon nitride.

7. The device of claim 1, wherein the transistor gate electrode comprises a material selected from a group consisting of polysilicon, metals, metal silicides, and metal nitrides.

8. The device of claim 1, wherein the trench plug comprises a material selected from a group consisting of silicon dioxide, germanium oxide, and polysilicon.

9. The device of claim 1, wherein the trench plug is silicon dioxide.

10. The device of claim 1, further comprising a channel stop region adjacent to the trench bottom surface.

11. A trench isolation structure in an integrated circuit comprising:
    a semiconductor substrate having a trench isolation region formed therein;
    an active region lying within the semiconductor substrate and abutting the trench isolation region;
    a first dielectric layer overlying only the active region;
    a second dielectric layer overlying the trench isolation region and the first dielectric layer, wherein the first dielectric layer and the second dielectric layer form a gate dielectric layer, the gate dielectric layer having a thickness of less than 20 nanometers; and
    a transistor gate electrode overlying the gate dielectric layer, the active region, and trench isolation region.

12. The device of claim 11, wherein the trench isolation region comprises:

a trench, the trench having a trench sidewall;

a trench liner adjacent the trench sidewall; and a trench plug adjacent the trench liner and substantially filling the trench.

13. The device of claim 11, wherein the first dielectric layer comprises a material selected from a group consisting of silicon dioxide and silicon oxynitride.

14. The device of claim 11, wherein the second dielectric layer is chemically vapor deposited silicon dioxide.

15. The device of claim 11, wherein the transistor gate electrode comprises a material selected from a group consisting of polysilicon, metals, metal silicides, and metal nitrides.

16. A trench isolation structure in an integrated circuit comprising:
- a semiconductor substrate having a trench formed therein, the trench having a trench bottom and a trench sidewall;
- an active region lying within the semiconductor substrate and abutting the trench sidewall;
- a dielectric trench plug lying within the trench and substantially filling the trench;
- a first dielectric layer overlying only the active region;
- a second dielectric layer overlying the dielectric trench plug and the first dielectric layer, wherein the first dielectric layer and the second dielectric layer form a gate dielectric layer, the gate dielectric layer having a thickness of less than 20 nanometers;
- a transistor gate electrode overlying the gate dielectric layer, the active region, and the dielectric trench plug.

17. The device of claim 16, further comprising a trench liner adjacent the trench sidewall and the trench bottom.

18. The device of claim 17, wherein the trench liner comprises a material selected from a group consisting of silicon dioxide, silicon oxynitride, and silicon nitride.

19. The device of claim 17, wherein the trench liner is a layer of thermal silicon dioxide.

20. The device of claim 16, wherein the first dielectric layer comprises a material selected from a group consisting of silicon dioxide and silicon oxynitride.

21. The device of claim 16, wherein the first dielectric layer is a layer of thermal silicon dioxide.

22. The device of claim 16, wherein the second dielectric layer is a layer of chemically vapor deposited silicon dioxide.

23. The device of claim 16, wherein the dielectric trench plug comprises a material selected from a group consisting of silicon dioxide and germanium oxide.

24. The device of claim 16, wherein the trench plug is silicon dioxide.

* * * * *